United States Patent [19]

Iizuka

[11] 4,384,300

[45] * May 17, 1983

[54] NEGATIVE RESISTANCE DEVICE

[75] Inventor: Tetsuya Iizuka, Kawasaki, Japan

[73] Assignee: Tokyo Shibaura Denki Kabushiki Kaisha, Kawasaki, Japan

[*] Notice: The portion of the term of this patent subsequent to Oct. 28, 1997, has been disclaimed.

[21] Appl. No.: 254,117

[22] Filed: Apr. 14, 1981

Related U.S. Application Data

[63] Continuation of Ser. No. 48,368, Jun. 14, 1979, abandoned.

[30] Foreign Application Priority Data

Jun. 21, 1978 [JP] Japan ................................. 53-74111
Jun. 21, 1978 [JP] Japan ................................. 53-74112

[51] Int. Cl.$^3$ ............................................. H01L 27/02
[52] U.S. Cl. ..................................... 357/42; 357/23; 357/51; 357/57; 357/86; 307/291
[58] Field of Search ..................... 357/23, 42, 57, 86, 357/51, 38; 307/291

[56] References Cited

U.S. PATENT DOCUMENTS

| | | | |
|---|---|---|---|
| 3,968,479 | 7/1976 | Goser | 307/291 |
| 4,053,798 | 10/1977 | Koike et al. | 357/42 |
| 4,064,525 | 12/1977 | Kano et al. | 357/42 |
| 4,231,055 | 10/1980 | Iizuka | 357/42 |

FOREIGN PATENT DOCUMENTS

| | | | |
|---|---|---|---|
| 2439875 | 4/1975 | Fed. Rep. of Germany | 357/42 |
| 2253284 | 6/1975 | France | 357/42 |

OTHER PUBLICATIONS

L. Hill et al., "Syn. of Electr. Bistable Ckts.," IEEE Trans. on Ckt. Theory, Mar. 1963, pp. 25-35.
S. Ostefjells, "Neg. Res. Ckt. Using Two Compl. FETs," Proc. IEEE, vol. 53, #4, Apr. 1965, p. 404.
R. Lohman, "Appl. of MOSFET's in Microelectronics," S-S Tech, Mar. 1966, pp. 23-29.
J. Wallmark et al., "Field Effect Transistors," ©1966, Prentice-Hall, Inc., TK7872.T73.W3, pp. XXII-XXIII.
Kaneko et al., "Low Power and High Speed Dig. Ckts. using MOS Trans," Meeting I.E.C.E., Japan, SSD-7-2-41, Nov. 1972, pp. 1-14.
A. Nguyen-Huu, "Advances in CMOS Dev. Tech.," Comput. Design, vol. 14, #1, Jan. 1975, pp. 87-92.
S. Koike et al., "New Two-Term. CMNOS Mem. Cells", IEEE Trans. on Elec. Dev., vol. ED-23, #9, Sep. 1976, pp. 1036-1241.
A. Ipri, "Lambda Diodes Util. An Enhance-Depl. CMOS/SOS Proc." IEEE Trans. on Elec. Dev., vol. ED-24, #6, Jun. 1977, pp. 751-756.

Primary Examiner—Joseph E. Clawson, Jr.
Attorney, Agent, or Firm—Oblon, Fisher, Spivak, McClelland & Maier

[57] ABSTRACT

A negative resistance device utilizing a substrate bias effect is comprised of two MOS transistors of n-channel type and p-channel type. The two transistors are connected at the sources and the gates. The drain of the n-channel MOS transistor is connected to the substrate of the p-channel MOS transistor. The drain of the p-channel MOS transistor is connected to the substrate of the n-channel MOS transistor.

8 Claims, 15 Drawing Figures

F I G. 5
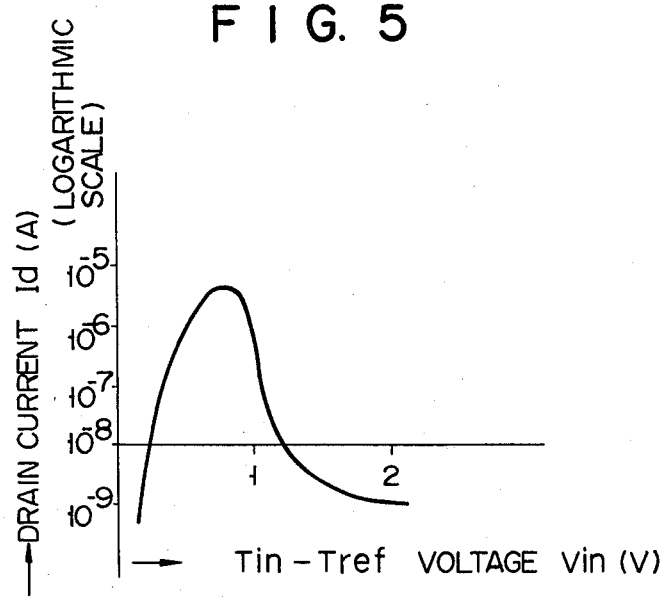
F I G. 6
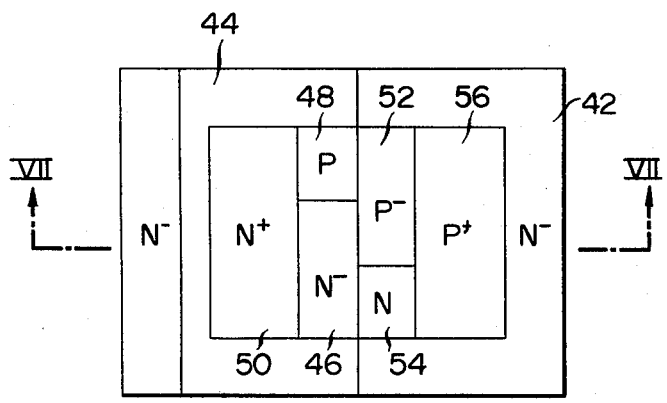

FIG. 10
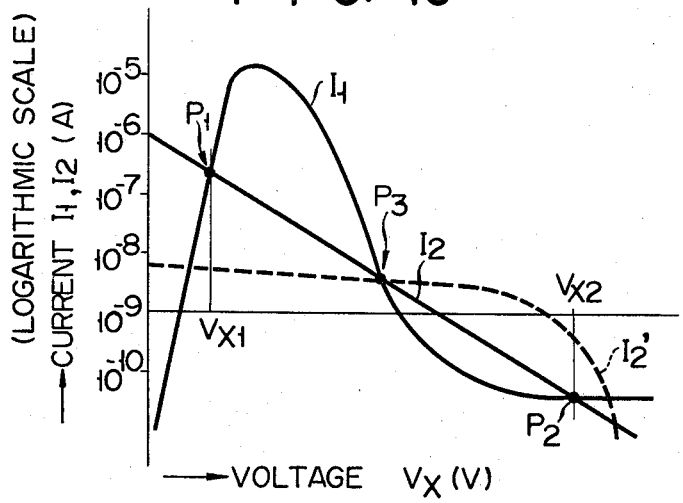
FIG. 11
FIG. 12
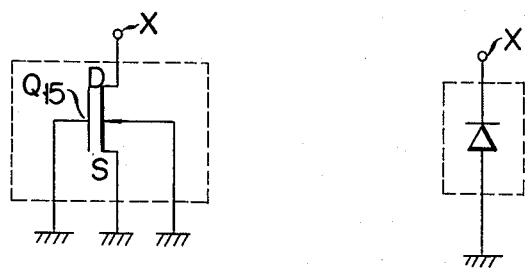
FIG. 13
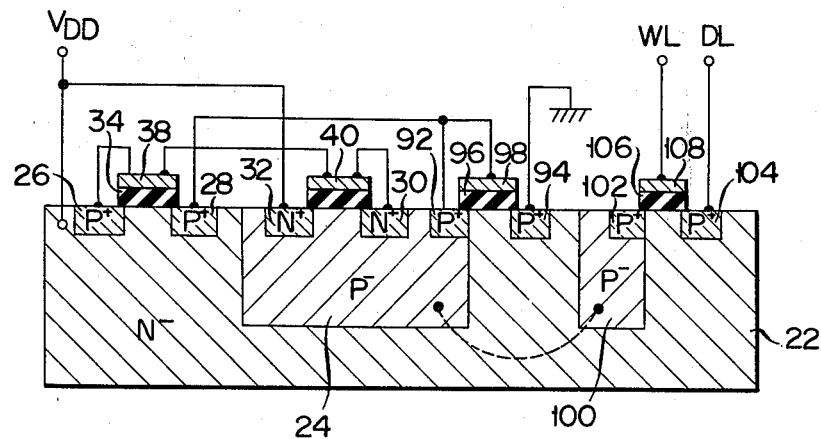

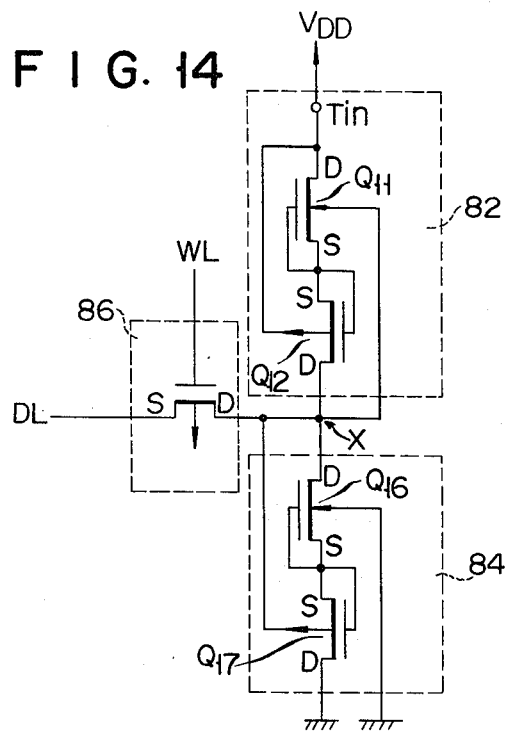
F I G. 14
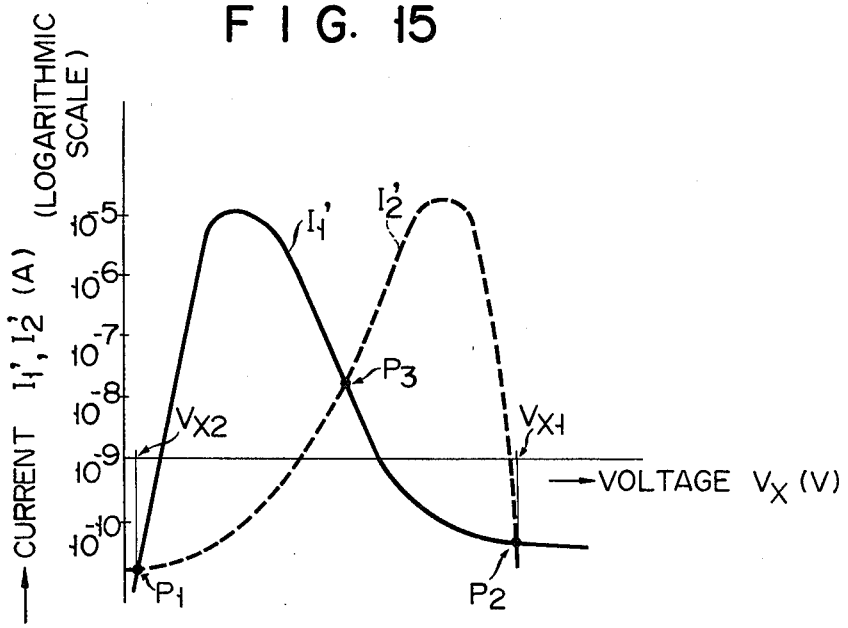
F I G. 15

NEGATIVE RESISTANCE DEVICE

This is a continuation of application Ser. No. 048,368, filed June 14, 1979, now abandoned.

BACKGROUND OF THE INVENTION

The present invention relates to a negative resistance device using an insulated gate field effect transistor (IGFET).

One of the known negative resistance devices is shown in FIG. 1 and is disclosed in an article "Semiconductor Transistor Study Material SSD, 72-41" published on 1972 by Tsushin Gakkai (the Japan Communication Society). Transistors Q1 and Q2 shown in FIG. 1 are each a metal oxide semiconductor field effect transistor (referred to as a MOS transistor) of the depletion type. Those transistors Q1 and Q2 are also of n- and p-channel types, being combined in a complementary MOS (C-MOS) fashion. Those transistors thus combined are conductive when the potential Vin at the input terminal Tin is low. As the potential Vin rises, the potential at the connection point A between the sources of the transistors Q1 and Q2 rises and the gate bias voltage of the transistor Q1 increases negatively. Accordingly, the channel conductance of the transistor Q1 decreases substantially exponentially and hence the drain current of the transistor Q1 decreases to render the transistor Q1 non-conductive. On the other hand, the gate bias of the transistor Q2 increases positively to render the transistor Q2 non-conductive. In this way, the circuit shown in FIG. 1 exhibits a negative resistance characteristic that, when the potential Vin is low, it is conductive but, when high, it is non-conductive.

The negative resistance device mentioned above utilizes the fact that the drain current depends on the gate bias and the operating current (drain current) is on the order of $\mu A$ to mA.

When the negative resistance device is applied to IC memories, for example, it is highly desirable to reduce the operating current. Further, in order to prevent punch-through, latch-up and the like, the drain areas of the transistors Q1 and Q2 must be widely separated each other with respect to the boundary between the semiconductor substrate and the p-well in the substrate, the boundary being interposed between both transistors. The wide separation between the drains hinders the improvement of the integration density when the circuit is fabricated by the IC technology.

SUMMARY OF THE INVENTION

Accordingly, an object of the invention is to provide a negative resistance device which is suitable for a high density integration.

Another object of the invention is to provide a negative resistance device which is operable with a reduced operating current.

Still another object of the invention is to provide a negative resistance device utilizing a substrate bias effect.

Yet another object of the invention is to provide a negative resistance device which is fit for a high density integration.

Another object of the invention is to provide a semiconductor device using a negative resistance device with a low operating current.

A further object of the invention is to provide a semiconductor device using a negative resistance device utilizing the substrate bias effect.

According to the invention, there is provided a negative resistance device comprising first and second IGFETs of n- and p-channel types commonly connected at the sources and the gates, in which the drain of the first IGFET is connected to the substrate of the second IGFET, and the drain of the first IGFET is connected to the substrate of the second IGFET.

Other objects and features of the invention will be apparent from following description taken in connection with the accompanying drawings, in which:

FIG. 5 shows a voltage between terminals Tin and Tref to drain current characteristic curve of the negative resistance device shown in FIGS. 2 and 5;

FIG. 6 shows a plan view of the negative resistance device in FIG. 3, particularly illustrating the respective semiconductor areas formed on the semiconductor substrate of the negative resistance device;

FIG. 10 shows a voltage to current characteristic of the memory device shown in FIG. 9;

FIGS. 11 and 12 show schematic circuit diagrams of load resistive devices;

FIG. 13 shows a cross sectional view of the semiconductor memory device shown in FIG. 9;

FIG. 14 shows a shematic diagram of another memory device using the negative resistance device shown in FIG. 2; and FIG. 15 shows a voltage to current characteristic of the memory device shown in FIG. 14.

DESCRIPTION OF THE PREFERRED EMBODIMENTS

Figure 1:
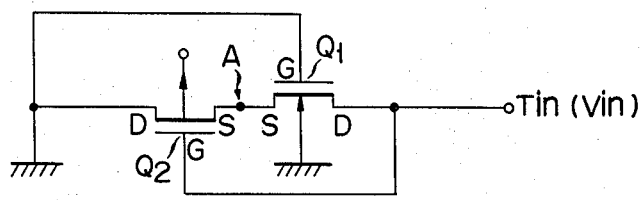
FIG. 1 shows a schematic diagram of a conventional negative resistance device.
Figure 2:
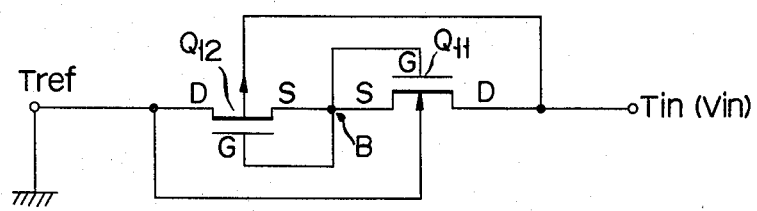
FIG. 2 shows a schematic diagram of a negative resistance device according to the invention.

Referring now to FIG. 2, there is shown an embodiment of a negative resistance device according to the invention. The negative resistance device is comprised of an n-channel depletion type MOS transistor Q11 and a p-channel depletion type MOS transistor Q12, these being connected in complementary fashion. As shown, the transistors Q11 and Q12 are commonly connected at the gates and the sources. These gates and sources are also mutually connected. The drain D of the transistor Q11 is connected to the substrate of the transistor Q12. The drain D of the transistor Q12 is similarly connected to the substrate of the transistor Q11. An input terminal Tin of the negative resistance device is connected to the drain D of the transistor Q11 and a reference potential terminal Tref is connected to the drain of the transistor Q12. The reference potential Tref is connected to the ground.

The operation of the negative resistance device thus constructed will be described. An input voltage Vin is first applied to the input terminal Tin. At this time, the potential at a point B is Vin/2 if the transistors Q11 and Q12 have the same characteristics. Accordingly, substrate bias voltages Vsub ($-\frac{1}{2}$ Vin) and ($+\frac{1}{2}$ Vin) with respect to the source potential are applied to the substrate of the transistors Q11 and Q12.

When the input voltage Vin is relatively low, the substrate bias Vsub is also low. Therefore, under this condition, both the transistors Q11 and Q12 are conductive. Within a region where the input voltage Vin is relatively low, both the transistors Q11 and Q12 are kept conductive while the drain current Id progressively increases as the input voltage Vin rises.

The substrate bias Vsub of each transistor Q11 and Q12 increases as the input voltage Vin increases. When the input voltage Vin rises and the potential at the point B exceeds a predetermined value, the channel conductance of each transistor Q11 and Q12 exponentially decreases. Accordingly, the drain current sharply and exponentially decreases so that the transistors Q11 and Q12 are non-conductive.

As described above, the negative resistance device shown in FIG. 2 exhibits a conductive state when the input voltage Vin is relatively low, and a non-conductive state when it rises to exceed a predetermined one. In this way, the negative resistance device operates as a negative resistance element.

An influence of the substrate bias Vsub upon the drain current is generally called a substrate bias effect. The substrate bias effect more greatly influences the drain current, particularly a called subthreshold current than the gate-source voltage Vgs. In other words, the subthreshold current more largely depends on the substrate bias voltage Vsub rather than the gate-source voltage Vgs.

Figure 3:
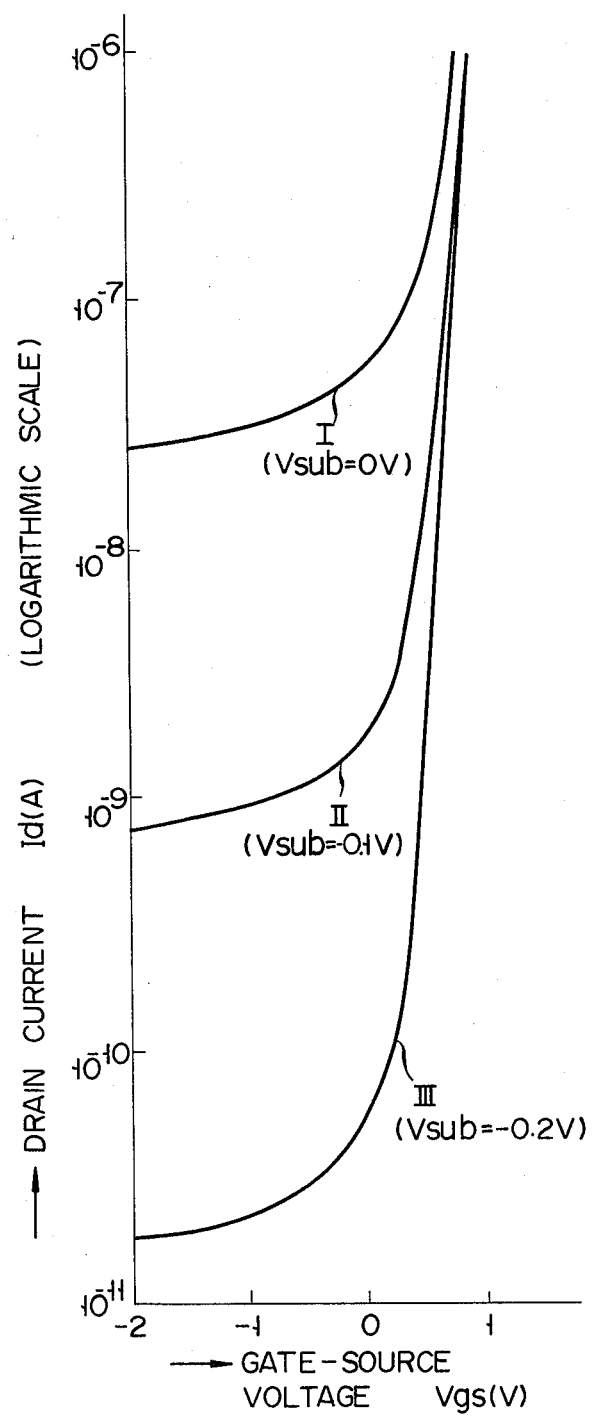
FIG. 3 shows gate-source voltage to drain current characteristic curves of the negative resistance device shown in FIG. 2.

This fact is seen from a graph illustrating a gate-source voltage Vgs to drain current Id (more strictly subthreshold current) characteristics shown in FIG. 3. The characteristic curves which were obtained by an experiment conducted by the inventor are depicted with parameters of the substrate bias Vsub on a graph having a y-coordinate axis representing drain current plotted on the logarithmic scale and an x-coordinate axis representing gate-source voltage. In the experiment an enhancement type n-channel MOS transistor was used whose substrate is a p-type silicon substrate with borron diffused of $1 \times 10^{13}$ cm$^{-3}$ as impurity material and with phosphorus of approximately $1 \times 10^{11}$ cm$^{-3}$ injected into the channel portion. Numbers I, II and III represent the characteristic curves for 0 V, $-0.1$ V and $-0.2$ V of the substrate bias voltage, respectively. As seen from the graphs, a slight increase of the substrate bias Vsub in the negative direction (in the graph, three subthreshold voltages are different each with 0.1 V) causes the drain current to greatly decrease. Thus, the drain current depends largely on the substrate bias voltage Vsub. More specifically, 2 V change of the gate-source voltage from $-2$ V to 0 V, for example, changes drain current relatively small. On the other hand, when the substrate bias voltage Vsub changes slightly by 0.2 V from 0 V to 0.2 V, the drain current greatly changes and the amount of the change is the difference between the characteristic curves I and III, and is considerably larger than that when the gate-source voltage Vgs changes by 2 V.

In short, the negative resistance device shown in FIG. 2 has a circuit construction in which the drain current (the subthreshold current) is controlled by the substrate bias voltage Vsub. Therefore, the device can effectively control the drain current to reduce the operating current in the order of nA to μA.

Other many experiments were conducted of various types of MOS transistors. These experiments show that, as the enhancement of the transistor is more intensive, that is, the threshold voltage of the enhancement type transistor is higher, the characteristic curves shown in FIG. 3 are shifted or extended to the right hand side. In the case of the p-channel transistor, these characteristic curves are distributed symmetrically with respect to the y-coordinate axis. The experiments showed that the substrate bias effect is more distinctive as the impurity concentration of the substrate is higher and the thickness of the gate insulating layer is thicker.

Figure 4:
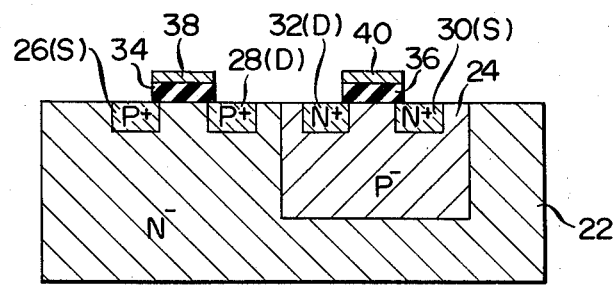
FIG. 4 shows a cross sectional view of the negative resistance device shown in FIG. 2 when it is expressed in structural version.

Turning now to FIG. 4, there is shown in cross sectional form a structure of the negative resistance device shown in FIG. 2. A substrate 22 for the transistor Q12 is an N type silicon plate with impurity concentration $1 \times 10^{15}$ cm$^{-3}$. A P$^-$ type well 24 with impurity concentration $1 \times 10^{16}$ cm$^{-3}$ forms the substrate of the transistor Q11. P+ type regions 26 and 28, which are diffusion layers each with impurity concentration $1 \times 10^{21}$ cm$^{-3}$, form the source and drain of the transistor Q12. N+ regions 30 and 32, which are diffusion layers each with impurity concentration $1 \times 10^{21}$ cm$^{-3}$, form the source and drain electrodes of the transistor Q11. Reference numerals 34 and 36 designate gate oxide layers and numerals 38 and 40 gate electrodes of the transistors Q12 and Q11, respectively. A proper amount of ion is doped into the channel portions of the transistors Q11 and Q12 in order to obtain a desired value of threshold voltage.

For simplicity of the explanation, no wiring is illustrated which is formed on the semiconductor substrate. In fact, however, the drain of one MOS transistor is connected to the substrate of the other transistor on the surface of the substrate, as will be seen from FIG. 2. For this, the drain and substrate of the transistors are at the same potential, with the result that no consideration must be taken of punch-through or latch-up. Therefore, the drain regions 28 and 32 of the transistors Q11 and Q12 may be formed adjacent to the boundary of the substrate 22 and the P$^-$-well 24, leading to the improvement of the integration density of the whole device.

It is as a matter of course that the P$^-$-well 24 and the regions 26 and 28 may be formed by the self-align process.

FIG. 5 shows a source-drain voltage to drain current characteristic of the negative resistance device shown in FIG. 4. In the graph illustrating this characteristic, the y-coordinate axis, which is plotted by the logarithmic scale, represents drain current and the x-coordinate axis Tin-Tref voltage. The maximum value of the drain current is determined by a degree of the substrate bias voltage dependency of the drain current. The minimum value thereof is determined by an amount of leak current. The degree of the falling-off of the drain current from the maximum depends on the impurity concentration of the substrate 22, the thickness of each gate oxide layers 34 and 36 and the like.

FIG. 6 illustrates pattern of the respective semiconductor regions suitable for the high density integration.

Figure 7:
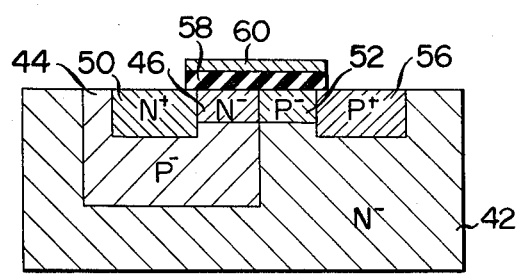
FIG. 7 shows a cross sectional view of the semiconductor device in FIG. 6 taken along line VII—VII.

The cross section of the semiconductor device shown in FIG. 6 is illustrated in FIG. 7. The cross section is taken along line VII—VII of the drawing of FIG. 6 and viewed in the direction of arrows at both the ends of the line.

As shown a P⁻-well 44 is formed in an N⁻ type silicon substrate 42. In the P⁻-well 44, an N⁻ region 46 and a p region 48 are formed at one side in contact of the N⁻ type silicon substrate 42. The P⁻ well 44 has an N⁺ region 50 formed therein at the other side in contact of the N⁻ region 46 and the P region 48. As well illustrated in FIG. 6, the length of the N⁻ region 46 is longer than the p region 48 as longitudinally viewed in the drawing. In the substrate 42, a P⁻ region 52 and an n region 54 are formed on the upper portion of the substrate 44, in contact with the regions 46 and 48 formed in the P⁻ well 44, as well illustrated in FIG. 6. The length of the P⁻ region 52 is longer than that of the N region 54 as longitudinally viewed in the drawing of FIG. 6. The lengths of the regions 48 and 54 are substantially equal each other. The lengths of the regions 46 and 52 are also substantially equal each other. As shown in FIG. 6, the P⁻ region 52 is in contact with the P region 48 and the N⁻ region 46 and the N region 54 comes in contact with only the N⁻ region 46. The substrate 42 further has a P⁺ region 56 formed in the upper and central portion of the substrate 42. The region 56 contacts at one side with the P⁻ region 52 and the N region 54 and at the other side with the substrate 42. The N⁺ region 50, the N⁻ region 46 and the N region 54 cooperate to form the transistor Q11. These regions 50, 46 and 54 serve as the source, channel and drain of the transistor. The P⁺ region 56, the P⁻ region 52 and the P region cooperate to form the transistor Q12. These regions 56, 52 and 48 serve as the source, channel and drain of the transistor.

The negative resistance device further has a common gate oxide layer 58 formed on the channels 46 and 52 and a common gate electrode 60 layered on the layer 58, as shown in FIG. 7 with such a construction, the drain regions 54 and 48 are disposed closely, as illustrated. Therefore, the negative resistance device according to the invention is suitable for the high intensity integration.

Note here that the MOS transistors Q11 and Q12 are not limited to the depletion type but is applicable for the enhancement type. The reason for this is that, also in the enhancement type transistor, the subthreshold current flows and depends largely on the substrate bias, as in the previous case.

When the negative resistance device shown in FIGS. 6 and 7 is constructed by using the enhancement type transistors, the N⁻ channel region 46 is replaced by a P channel region and the P⁻ channel region 52 by an N⁻ channel region.

Figure 8:
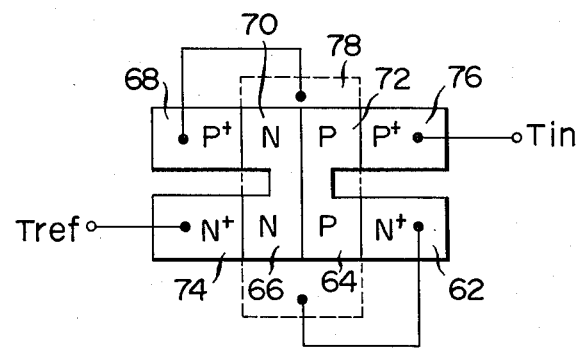
FIG. 8 shows a plan view of the negative resistance device according to the invention which illustrates particularly another pattern suitable for a high density integration.

In the negative resistance device shown in FIG. 2 or 4, the transistor Q11 may be such a type transistor of which the threshold value is negative when the potential difference between the substrate and the source is 0 V. The transistor Q12 may be such a transistor of which the threshold voltage is positive in the same condition. Conversely, a transistor exhibiting a positive value when the substrate to source potential is 0 V may be used for the transistor Q11. A transistor exhibiting a negative value in the same condition is usable for the transistor Q12. If the respective regions are patterned, as shown in FIG. 8, the negative resistance device suitable for the high integration may be fabricated. In FIG. 8, an N⁺ region 62, a P region 64 and an N region 66 cooperatively form a transistor Q11 while a P⁺ region, an N region 70 and a P region 72 cooperatively form a transistor Q12. As shown, the P regions 64 and 72 form a common region and N regions 66 and 70 also form a common region. The N⁺ region 74 and the P⁺ region 76 form drain regions with high impurity concentrations of the transistors Q12 and Q11. On the common N regions 66 and 70 and the common P regions 64 and 72, a gate electrode 78 indicated by a dotted line is formed with interposition therebetween of an insulating layer (not shown). The gate electrode 78 and the P⁺ region 68 are electrically connected, for example, by depositing aluminum. The gate electrode 78 and the N⁺ region 62 are also connected similarly. The P⁺ region 76 which is the drain region of the transistor Q11 is connected to the input terminal Tin while the N⁺ region 74 which is the drain region of the transistor Q12 is connected to the reference potential terminal.

When the semiconductor device with the pattern as shown in FIG. 8 is fabricated in the semiconductor substrate, for example, an N type semiconductor substrate, a P-well is formed in the substrate and the N⁺ region 62, the common P-regions 64 and 72 and the P⁺ region 76 are further formed in the P-well. When a P-type semiconductor substrate is used in place of the N-type semiconductor substrate, an N-well is formed in the substrate and the N⁺ region 74, the common N-regions 64 and 70 and the P⁺ region 68 are formed in the N-well.

When an insulating substrate, for example, a sapphier substrate, is used, a semiconductor substrate must be formed on the sapphier substrate in the following process. Firstly, a field oxide layer such as a SiO₂ layer is formed on the sapphire substrate. Secondly, a given portion of the field oxide layer is etched away by the etching method, for example. Thirdly, silicon is vapor-deposited over the etched-away portion by the vapor deposition method, for example. The semiconductor device patterned as shown in FIG. 8 is formed on the silicon substrate thus fabricated.

Figure 9:
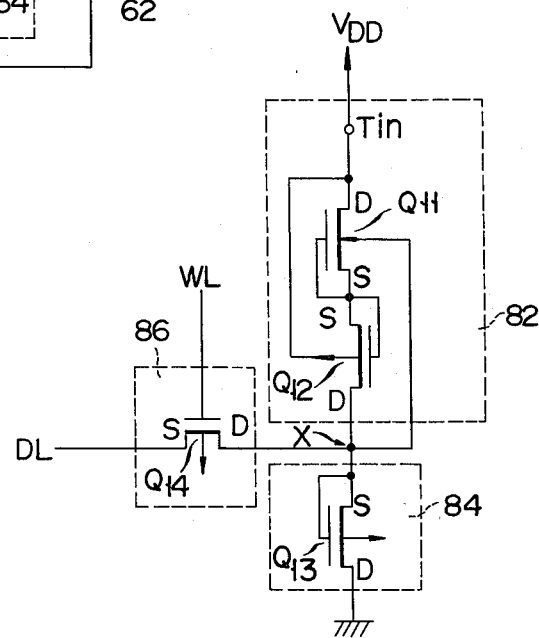
FIG. 9 shows a semiconductor memory device using the negative resistance device shown in FIG. 2.

An application of the negative resistance device thus far described will be given with reference to FIG. 9 illustrating a semiconductor memory device into which a negative resistance device is incorporated. As shown, the semiconductor memory device is comprised of a negative resistance device 82 and a load resistance including a MOS transistor Q13 designated by reference numeral 84. The drain of the transistor Q11 is connected to a power source $V_{DD}$ via an input terminal Tin. The drain of the transistor Q12 is connected to the source of the transistor Q13 constituting the load resistor 84. The transistor Q13 may be a p-channel enhancement mode transistor. The gate and the source of the transistor Q13 are interconnected and the drain also is connected to the ground. Currents I1 and I2 flowing through the negative resistance device 82 and the load resistor 84 vary as shown in FIG. 10 with respect to the voltage at a point X (connecting point between the negative resistance device 82 and the load resistor 84) of the semiconductor memory device. Of three cross points P1, P2 and P3 on the current curves I1 and I2, two cross points P1 and P2 are stable points and the cross point P3 is an unstable point. When the potentials Vx1 and Vx2 at the point X corresponding to the cross points P1 and P2 are made to correspond to logical '0' and logical '1', the semiconductor device may be used as a memory device. The data stored at the point X in the form of logical '0' or '1' is read out by a transfer gate circuit 86 including a p-channel enhancement mode MOS transistor Q14. In the read-out operation, a pulse is applied to a word line WL connected to the gate of the transistor Q14 to cause the transistor Q14 to conduct, and in turn to electrically connect a bit line DL to the connection point X, thereby to read out the data at the connection point X.

The MOS transistor Q13 as the load resistor 84 may be substituted by an N-channel MOS transistor which is grounded at the gate, the source and the substrate, as shown in FIG. 11. The current behavior of the n-channel MOS transistor is depicted by a curve indicated by a dotted line in FIG. 10. In the semiconductor memory shown in FIG. 9, the negative resistance device 82 and the load resistor 34 may be interchanged each other. In this case, the power source voltage $V_{DD}$ is applied to the source of the MOS transistor Q13 and the drain of the transistor Q12 is grounded. Further, the MOS transistor Q13 may be replaced by a diode inversely biased as shown in FIG. 12.

Turning now to FIG. 13, there is shown a cross sectional view of the semiconductor memory device shown in FIG. 9. In the cross section, the construction of the negative resistor device is the same as that of FIG. 4 and hence like reference numerals are attached to the like portions with omission of the explanation thereof. The explanation of the cross section will be directed to on the load resistor and the transfer gate circuit.

As shown in FIG. 13, N+ regions 30 and 32 and a P+ region 92 serving as the source of the transistor Q13 (load resistor 84) are formed in a P− well 24 as the substrate of the transistor Q11. A P+ region 94 serving as the drain of the transistor Q13 is formed properly separated from the P+ region 92 within the substrate 22. A gate electrode 98 layered on a gate insulating layer 96 is formed on the substrate 22, being disposed between the P+ region 92 and the P+ region 94. The region 100 being the part of the P− well 24 has a P+ region 102 serving as the source of a MOS transistor Q14 (transfer gate circuit 86). A P+ region 104 to be the drain of the transistor Q14 is provided in the substrate 22, properly separated from the P− well. A gate electrode 108 layered on a gate oxide layer 106 is formed on the substrate 22 between the P+ source region 102 and the P− region 104.

FIG. 14 shows another example of the semiconductor memory device in which the negative resistance device shown in FIG. 2 is used for the load resistor 84.

As shown, the load resistor 84 comprising the transistor Q13 in the semiconductor memory device shown in FIG. 9 is substituted by a negative resistance device of the C-MOS type having MOS transistors Q16 and Q17 which is the same construction as the negative resistance device 82.

In the semiconductor memory device with such a construction, the current I1 flowing through the negative resistance device 82 and the current I2 flowing through the negative resistance device 84 vary as shown in FIG. 15 with respect to a voltage at the point X in FIG. 14. In the graph in FIG. 15, stable points are cross points P1 and P2 on the current curves I1' and I2' and an unstable point is a cross point P3. As in the previous case, if the potentials Vx1 and Vx2 corresponding to the stable points P1 and P2 are made to correspond to logical '0' and '1', the semiconductor device may be used as a memory device. In the graph, the x-coordinate axis representing the current is expressed by the logarithmic scale.

The semiconductor memory devices shown in FIGS. 9 and 13 also utilize the substrate bias effect and hence it may be fabricated with a high density integration and is operable with a low operating current.

What is claimed is:

1. A negative resistance device comprising:
   a semiconductor substrate of a first conductivity type;
   a first IGFET of a first channel type formed in the semiconductor substrate, the first IGFET having a drain terminal, a source terminal, a gate terminal, a substrate terminal, a drain region, a source region and a channel region; and
   a second IGFET of a second channel type formed in the semiconductor substrate, the second IGFET having a drain terminal, a source terminal, a gate terminal, a substrate terminal, a drain region, a source region and a channel region;
   both the source terminal and gate terminal of said first IGFET being connected to the source and gate terminals of said second IGFET, the drain terminal of said first IGFET being connected to the substrate terminal of said second IGFET, the drain terminal of said second IGFET being connected to the substrate terminal of said first IGFET, and the drain regions and the channel regions of said first and second IGFETs being formed below a common gate electrode layer and overlapping the common gate electrode layer; and
   said first and second IGFETs comprising a first region of a second conductivity type formed in the semiconductor substrate, a second region of the second conductivity type formed in the semiconductor substrate and in contact with the boundary between the semiconductor substrate and the first region, a third region of the first conductivity type formed in the first region and in contact with said boundary, a fourth region of the second conductivity type formed in the semiconductor substrate and disposed in contact with the second region and separated from said boundary, a fifth region of the first conductivity type formed in the first region and disposed in contact with the third region and separated from said boundary, an insulation layer formed on the surface of the second and third regions, and a common gate electrode layer formed on the insulation layer and overlapping the second and third regions.

2. A negative resistance device according to claim 1, wherein a sixth region of the first conductivity type and a seventh region of the second conductivity type are formed in the second region and the third region, respectively.

3. A semiconductor device comprising a negative resistance device and a load resistor connected to the negative resistance device, said negative resistance device comprising:
   a semiconductor substrate of a first conductivity type;
   a first IGFET of a first channel type formed in the semiconductor substrate, the first IGFET having a drain terminal, a source terminal, a gate terminal, a substrate terminal, a drain region, a source region and a channel region; and
   a second IGFET of a second channel type formed in the semiconductor substrate, the second IGFET having a drain terminal, a source terminal, a gate terminal, a substrate terminal, a drain region, a source region and a channel region;

both the source terminal and gate terminal of said first IGFET being connected to the source and gate terminals of said second IGFET, the drain terminal of said first IGFET being connected to the substrate terminal of said second IGFET, the drain terminal of said second IGFET being connected to the substrate terminal of said first IGFET, and the drain regions and channel regions of said first and second IGFETs being formed below a common gate electrode layer and overlapping the common gate electrode layer; and said first and second IGFETs comprising a first region of a second conductivity type formed in the semiconductor substrate, a second region of the second conductivity type formed in the semiconductor substrate and in contact with the boundary between the semiconductor substrate and the first region, a third region of the first conductivity type formed in the first region and in contact with said boundary, a fourth region of the second conductivity type formed in the semiconductor substrate and disposed in contact with the second region and separated from said boundary, a fifth region of the first conductivity type formed in the first region and disposed in contact with the third region and separated from said boundary, an insulation layer formed on the surface of the second and third regions, and a common gate electrode layer formed on the insulating layer and overlapping the second and third regions.

4. A semiconductor device according to claim 3, wherein a sixth region of the first conductivity type and a seventh region of the second conductivity type are formed in the second region and the third region, respectively.

5. A semiconductor device according to claim 3, or 4 further comprising an IGFET connected to the node where said negative resistance device and said load resistor are connected.

6. A semiconductor device according to claims 3, or 4, wherein said load resistor is an IGFET.

7. A semiconductor device according to claim 3, or 4 wherein said load resistor includes a third IGFET of a first channel type connected at the drain terminal to said negative resistance device, a fourth IGFET of a seond channel type connected at the drain terminal to ground, the source and gate terminals of said third IGFET are connected to those of said fourth IGFET, the drain terminal of said third IGFET is connected to the substrate terminal of said fourth IGFET, and the drain terminal of said fourth IGFET is connected to the substrate terminal of said third IGFET.

8. A semiconductor device according to claim 3, or 4, wherein said load resistor is a diode inversely biased.

* * * * *